(12) United States Patent
Taskar et al.

(10) Patent No.: US 9,704,761 B2
(45) Date of Patent: Jul. 11, 2017

(54) CORROSION SENSOR RETAINER ASSEMBLY APPARATUS AND METHOD FOR DETECTING CORROSION

(71) Applicant: Lam Research Corporation, Fremont, CA (US)

(72) Inventors: Mark Taskar, San Mateo, CA (US); Iqbal Shareef, Fremont, CA (US); Anthony Zemlock, Tracy, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 322 days.

(21) Appl. No.: 14/489,148

(22) Filed: Sep. 17, 2014

(65) Prior Publication Data

US 2016/0076989 A1    Mar. 17, 2016

(51) Int. Cl.
  *G01N 17/02*    (2006.01)
  *H01L 21/66*    (2006.01)
  *H01L 21/67*    (2006.01)

(52) U.S. Cl.
  CPC ........ *H01L 22/10* (2013.01); *H01L 21/67017* (2013.01)

(58) Field of Classification Search
  CPC ................................ G01N 17/00; H01L 22/10
  USPC ........................................................ 324/700
  See application file for complete search history.

(56) References Cited

U.S. PATENT DOCUMENTS

| | | | |
|---|---|---|---|
| 5,246,235 A | 9/1993 | Heinzen | |
| 5,865,971 A * | 2/1999 | Sunkara | F16J 15/064 204/280 |
| 6,357,764 B1 | 3/2002 | Gaines et al. | |
| 7,152,375 B1 | 12/2006 | Mastro et al. | |
| 7,309,414 B2 | 12/2007 | Yang | |
| 7,316,154 B1 | 1/2008 | Bennett | |
| 7,350,476 B2 | 4/2008 | Fink | |
| 7,487,738 B2 | 2/2009 | Hayashi | |
| 8,322,380 B2 | 12/2012 | Tasker | |
| 8,327,878 B2 | 12/2012 | Lee et al. | |
| 8,448,949 B2 | 5/2013 | Stewart et al. | |
| 8,794,267 B2 | 8/2014 | Shareef et al. | |
| 2005/0041238 A1 | 2/2005 | Ludviksson et al. | |
| 2005/0068519 A1 | 3/2005 | O'Meara et al. | |
| 2005/0070104 A1 | 3/2005 | O'Meara et al. | |
| 2005/0214445 A1 | 9/2005 | Wajda et al. | |
| 2010/0206049 A1 | 8/2010 | Kasama et al. | |
| 2010/0326554 A1 * | 12/2010 | Taskar | F16K 27/003 137/884 |
| 2011/0187395 A1 | 8/2011 | Morgan et al. | |
| 2012/0043981 A1 * | 2/2012 | Chiang | G01N 17/02 324/700 |

(Continued)

*Primary Examiner* — Melissa Koval
*Assistant Examiner* — Courtney McDonnough

(57) ABSTRACT

A corrosion sensor retainer assembly and method for predicting and detecting corrosion within a gas delivery system of a semiconductor substrate processing apparatus. The corrosion sensor retainer assembly comprises a laminate that includes a first insulating layer with a first port and a second insulating layer with a second port, wherein the first port and the second port are configured to retain a seal. The corrosion sensor retainer assembly includes a conductor housed within the laminate. The conductor forms a path that extends around the first port and the second port. At least a portion of the conductor has an exposed surface with a property that changes in the presence of corrosive gas or acid.

20 Claims, 8 Drawing Sheets

(56) References Cited

U.S. PATENT DOCUMENTS

2012/0119448 A1\* 5/2012 Stewart ................ F16J 15/064
                                                        277/650
2012/0174396 A1    7/2012  Hefner et al.
2012/0176148 A1    7/2012  Chey et al.
2013/0069676 A1    3/2013  Steinwandel et al.

\* cited by examiner

CORROSION SENSOR RETAINER ASSEMBLY APPARATUS AND METHOD FOR DETECTING CORROSION

FIELD OF THE INVENTION

The invention relates to semiconductor substrate processing apparatuses and more specifically to a corrosion sensor retainer assembly and method for predicting corrosion in delivery systems for delivering gas to a vacuum chamber of a semiconductor substrate processing apparatus.

BACKGROUND

Semiconductor substrate processing apparatuses are used for processing semiconductor substrates by techniques including, but not limited to, plasma etching, physical vapor deposition (PVD), chemical vapor deposition (CVD), plasma enhanced chemical vapor deposition (PECVD), atomic layer deposition (ALD), plasma enhanced atomic layer deposition (PEALD), ion implantation, and resist removal. Semiconductor substrate processing apparatuses include gas delivery systems through which process gas is flowed and subsequently delivered into a processing region of a vacuum chamber of the apparatus by a gas distribution member such as a showerhead, gas injector, gas ring, or the like. For example, the gas delivery system can be configured to supply process gas to a gas injector positioned in the chamber above a semiconductor substrate so as to distribute process gas over a surface of the semiconductor substrate being processed in the chamber. Current gas delivery systems are constructed from many individual components, many of which have conduits therein through which process gas flows. The interfaces between individual components utilize seals therebetween such that leaking does not occur when process gas is being supplied through the conduits of the assembled gas delivery system.

Many components of a gas delivery system are formed from metal, such as stainless steel. A seal between components can become corroded and leak, which may lead to failure of the individual components and contamination of semiconductor substrates during processing thereof. For example, plasma gases used for ETCH processes react with stainless steel components leading to corrosion, which can cause low yields and poor performance of semiconductor devices. Corrosion compromises gas purity and quality of semiconductor devices. For instance, hydrogen bromide gas (HBr), in the presence of ambient moisture, can create a strong acid and start the corrosion process, according to the chemical reaction $\frac{1}{2}O_2 + 2HBr + Fe = FeBr_2 + H_2O$ on stainless steel. Thus, there is a need for predicting and detecting the beginning of leaks and corrosion, in order to prevent major failure of components or contamination of semiconductor substrates.

SUMMARY

Disclosed herein is a corrosion sensor retainer assembly for predicting and detecting corrosion within a gas delivery system of a semiconductor substrate processing apparatus. The corrosion sensor retainer assembly comprises a laminate with at least a first insulating layer including at least a first port and at least a second insulating layer including at least a second port, wherein the first port and the second port are configured to retain a seal. The corrosion sensor retainer assembly further comprises at least one conductor forming a path that extends around at least part of the first port and the second port, wherein the conductor is housed within the laminate between the first insulating layer and the second insulating layer. At least a portion of the path of the conductor has an exposed surface.

Also disclosed herein is a method of predicting and detecting corrosion within a gas delivery system of a semiconductor substrate processing apparatus with a corrosion sensor retainer assembly. The method comprises passing a processing gas through a seal retained by a corrosion sensor retainer assembly, wherein the corrosion sensor retainer assembly includes a laminate comprising at least a first insulating layer including at least a first port and at least a second insulating layer including at least a second port. The method further comprises retaining the seal by the first port and the second port and monitoring a parameter of a circuit that includes at least one conductor forming a path that extends around at least part of the first port and the second port. The conductor is housed within the laminate between the first insulating layer and the second insulating layer, and at least a portion of the path of the conductor having an exposed surface, wherein the parameter is related to a property of the exposed surface. The method includes comparing the parameter to a predetermined value and detecting the presence of a corrosive gas based on a result of the comparison.

BRIEF DESCRIPTION OF THE DRAWING FIGURES

DETAILED DESCRIPTION

Figure 1:
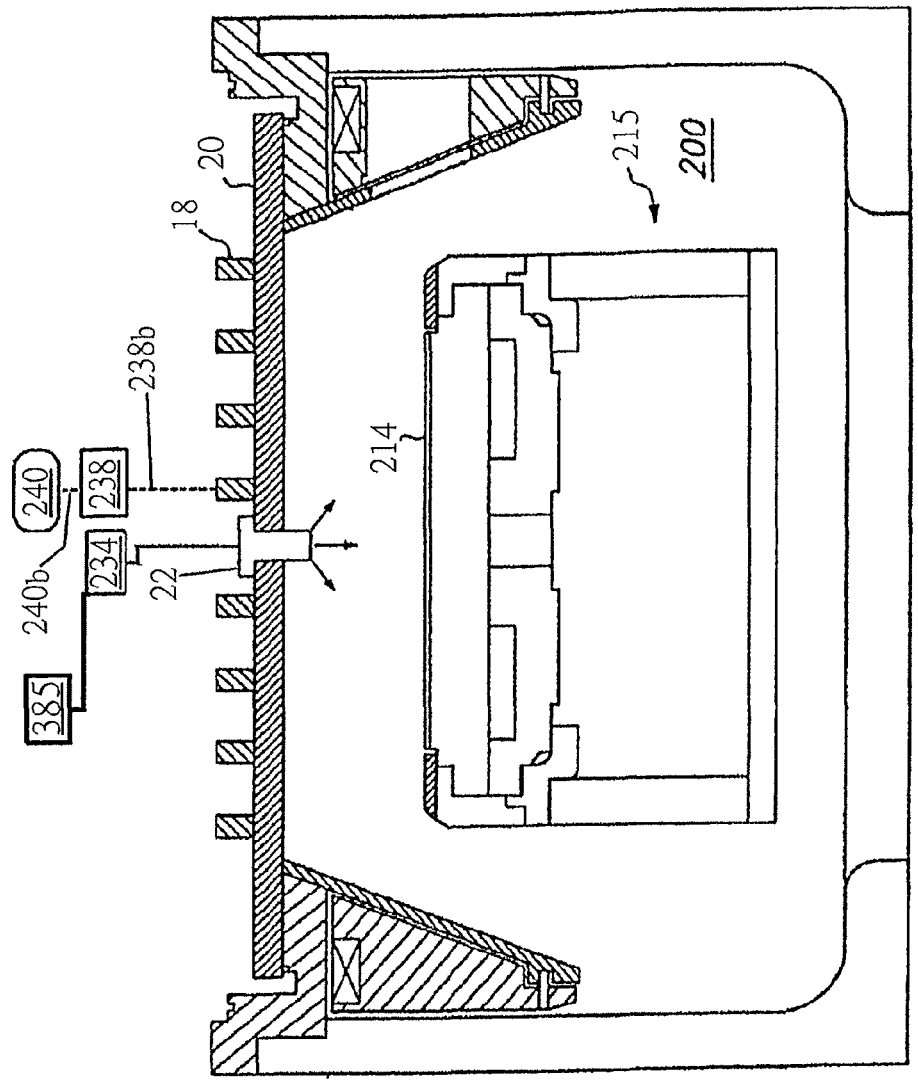
FIG. 1 illustrates an embodiment of a semiconductor substrate processing apparatus in accordance with embodiments disclosed herein.

Disclosed herein is a corrosion sensor retainer assembly for a gas delivery system of a semiconductor substrate processing apparatus and a method of detecting corrosion in a gas delivery system during processing of the semiconductor substrate. The semiconductor substrate processing apparatus can be used for processing semiconductor substrates by techniques including, but not limited to, plasma etching, physical vapor deposition (PVD), chemical vapor deposition (CVD), plasma enhanced chemical vapor deposition (PECVD), atomic layer deposition (ALD), plasma enhanced atomic layer deposition (PEALD), ion implantation, or resist removal. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure present embodiments disclosed herein. Additionally, as used herein, the term "about" when used with reference to numerical values refers to ±10%.

As integrated circuit devices continue to shrink in both their physical size and their operating voltages, their associated manufacturing yields become more susceptible to contamination. Consequently, fabricating integrated circuit devices having smaller physical sizes requires that the level of contamination be less than previously considered to be acceptable. In addition, the wafers and processing equipment used in semiconductor processing are becoming more complex and larger in size, in order to produce more dies per wafer. Accordingly, failures due to corrosion that ruin the equipment and wafers are becoming more costly.

Thus, control of corrosion and contamination during the fabrication of integrated circuits thereon is useful in achieving reliable devices and preserving processing equipment. Processing equipment, such as gas delivery systems of semiconductor substrate processing apparatuses, can be compromised, when components of gas delivery systems are corroded and/or eroded. For example, a strong acid may be produced when the processing gas is exposed to the moisture.

Ambient air contains about 1000 ppm of moisture. Hydrogen bromide gas only needs about 1-2 ppm of moisture in air in order to create a strong acid to start the corrosion process. This acid is strong enough to dissolve stainless steel and other metals that are used for components in gas distribution systems of semiconductor processing apparatuses.

Gas distribution systems of semiconductor substrate processing apparatuses can utilize gas sticks which are a series of gas distribution and control components such as a mass flow controller, one or more pressure transducers and/or regulators, a heater, one or more filters or purifiers, manifolds, gas flow adaptors, and shutoff valves. The components used and their particular arrangement in a gas stick can vary depending upon their design and application, with many component arrangements being known in the art. For example, in a semiconductor substrate processing arrangement, over seventeen process gases can be supplied to the chamber via gas supply lines, and gas distribution system components. The gas distribution system components are attached to a base plate (i.e. gas pallet) forming the system which is also known as a "gas panel" or "gas box".

As explained above, in semiconductor manufacturing, processes have become increasingly intolerant of contamination as the dimensions of semiconductor devices decrease and there is less room to accommodate more components. In the event of a failed seal, the entire semiconductor substrate may be ruined, in addition to components of the gas distribution system.

Accordingly, disclosed herein is a method of predicting and detecting corrosion within a gas delivery system of a semiconductor substrate processing apparatus with a corrosion sensor retainer assembly. As discussed above, gas delivery system components are made from metals such as stainless steel wherein constituent components had to be assembled together, requiring interfaces and seals between the constituent components, in order to achieve a desired conduit path for process gas to flow therethrough due to the tolerances of machining the prior art metal constituent components and further due to the desire to coat the process wetted surfaces forming the conduits of the prior art constituent components with a protective coating.

Corrosion, erosion, and/or corrosion/erosion can occur in environments that may contain oxygen, halogens, and/or hydro-fluorocarbon process gas, or process gases which may be used in semiconductor substrate processing such as but not limited to, $Cl_2$, HCl, $BCl_3$, $Br_2$, HBr, $O_2$, $SO_2$, $CF_4$, $CH_2F_2$, $NF_3$, $CH_3F$, $CHF_3$, and $SF_6$.

FIG. 1 illustrates an embodiment of a semiconductor substrate processing apparatus which can include a gas delivery system 234 including a corrosion sensor retainer assembly, as disclosed herein. As shown in FIG. 1, an inductively coupled plasma processing apparatus can include a vacuum chamber 200 (i.e. plasma etch chamber). The vacuum chamber 200 includes a substrate support (lower electrode assembly) 215 for supporting a semiconductor substrate 214 in the interior of the vacuum chamber 200. A dielectric window 20 forms a top wall of vacuum chamber 200. Process gases are injected to the interior of the vacuum chamber 200 through a gas injector 22. The gas delivery system 234 supplies process gases to the interior of the vacuum chamber 200 through gas injector 22. Parameters (e.g., temperature, flow rate, and chemical makeup) of the process gases supplied to the interior of the vacuum chamber by the gas delivery system are preferably controlled by a control system 385.

Once process gases are introduced into the interior of vacuum chamber 200, they are energized into a plasma state by an antenna 18 supplying energy into the interior of vacuum chamber 200. Preferably, the antenna 18 is an external planar antenna powered by a RF power source 240 and RF impedance matching circuitry 238 to inductively couple RF energy into vacuum chamber 200. However, in an alternate embodiment, the antenna 18 may be an external or embedded antenna which is nonplanar. An electromagnetic field generated by the application of RF power to the antenna energizes the process gas in the interior of the vacuum chamber 200 to form high-density plasma (e.g., $10^9$-$10^{12}$ ions/cm$^3$) above substrate 214. During an etching process, the antenna 18 (i.e. a RF coil) performs a function analogous to that of a primary coil in a transformer, while the plasma generated in the vacuum chamber 200 performs a function analogous to that of a secondary coil in the transformer. Preferably, the antenna 18 is electrically connected to the RF impedance matching circuitry 238 by an electrical connector 238b (i.e. lead) and the RF power source 240 is electrically connected to the RF impedance matching circuitry 238 by an electrical connector 240b.

Figure 2:
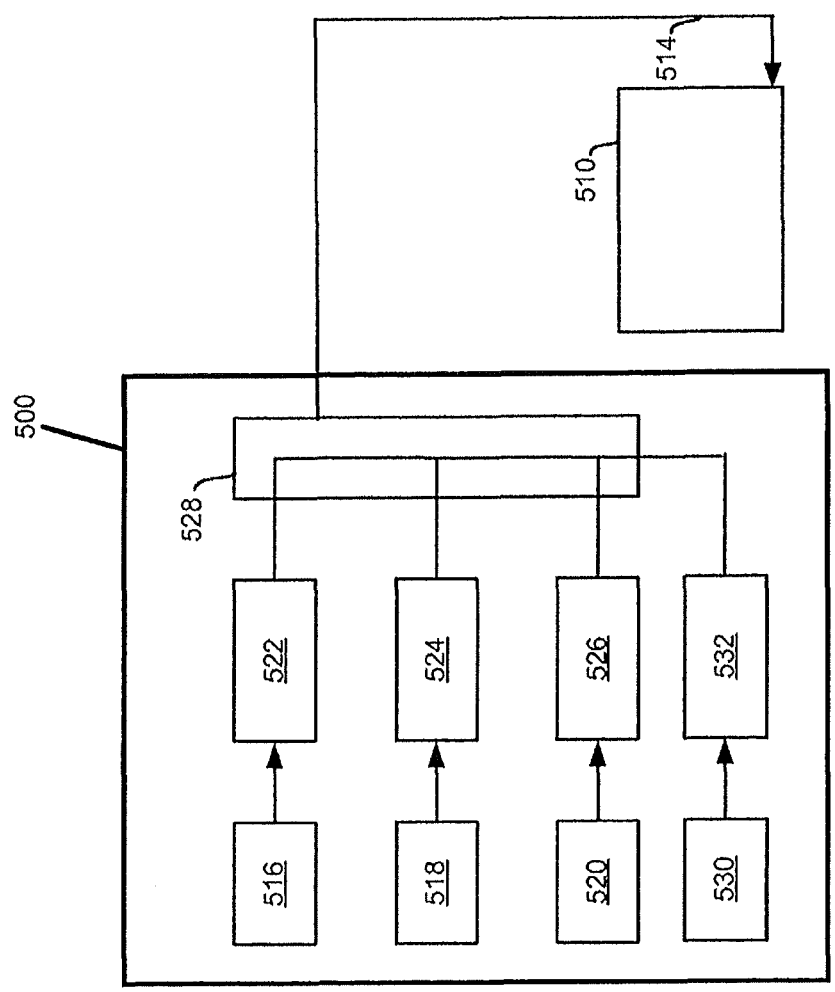
FIG. 2 is a schematic of a gas delivery system in accordance with embodiments disclosed herein.

FIG. 2 is a schematic view of an exemplary gas delivery system 500 for a semiconductor substrate processing apparatus including a corrosion sensor retainer assembly. A vacuum chamber 510 of a semiconductor substrate processing apparatus is supplied process gas through a gas supply line 514. The gas supply line 514 can provide process gases to a gas distribution member such as a showerhead or a gas injector arranged in the upper portion of the vacuum chamber 510, and downstream of the gas delivery system 500. Additionally, gas supply line 514 may supply process gas to a lower portion of the vacuum chamber such as, for example, to a gas distribution ring surrounding the semiconductor substrate support or through gas outlets arranged in the substrate support. Processing gas may be supplied to gas supply line 514 from gas supplies 516, 518, 520, 530 with the process gases from gas supplies 516, 518, 520, 530 being supplied to MFCs 522, 524, 526, 532 respectively. The MFCs 522, 524, 526, 532 supply the process gases to a mixing manifold 528 after which the mixed gas is directed to gas supply line 514. The gas delivery system 500 preferably has one or more corrosion sensor retainer assemblies positioned between components requiring a seal.

Figure 3:
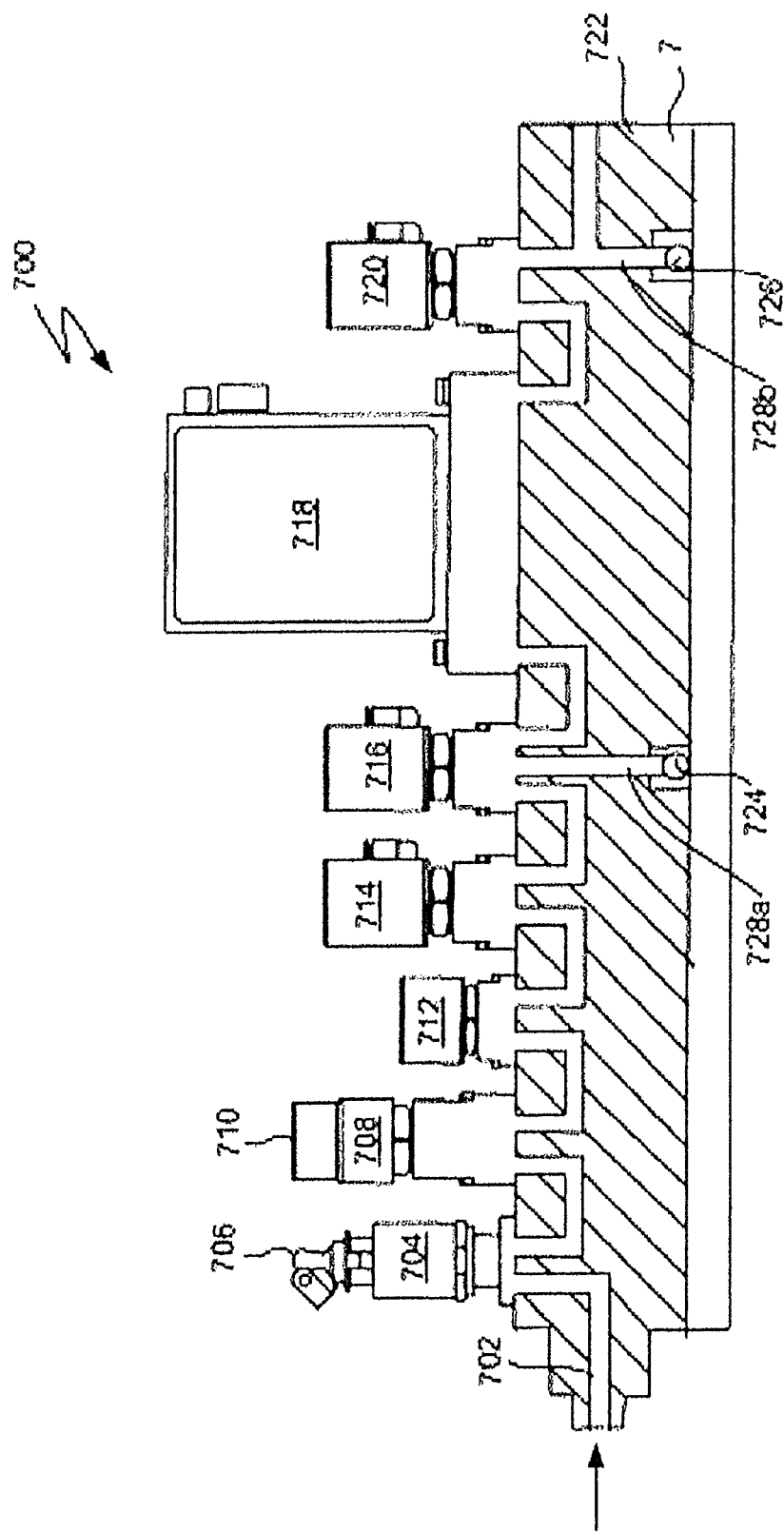
FIG. 3 illustrates an embodiment of a gas stick for which a corrosion sensor retainer assembly is inserted between components in accordance with embodiments disclosed herein.

FIG. 3 illustrates a cross section of a gas stick 700 which may be included in a gas delivery system that can include one or more corrosion sensor retainer assemblies between components as disclosed herein. Although the gas stick is illustrated with certain components, the specific components are not intended to be limiting as different components may be used and/or less or more components may be used to form the gas stick. Additionally, although described with a single gas stick, the number of gas sticks is not intended to be limiting. As discussed above, a plurality of gas sticks, form a gas box or panel. In an embodiment, each valve on the components can be an integrated surface mount valve. In general, an integrated surface mount component is a gas control component (e.g., valve, filter, etc.) that is connected to other gas control components through channels (e.g., conduits) on a mount assembly, upon which the gas control components are mounted. A corrosion sensor retainer assembly is inserted between an integrated surface mount component and a mount assembly.

The gas stick 700 may have a gas stick input port 702 to input a supply gas. A manual valve 704 may be used for carrying out the supply or isolation of the supply of supply gas. The manual valve 704 may also have a lockout/tagout device 706 above it. Worker safety regulations often mandate that plasma processing manufacturing equipment include activation prevention capability, such as a lockout/tagout mechanism. Generally a lockout is a device that uses positive means such as a lock, either key or combination type, to hold an energy-isolating device in a safe position. A tagout device is generally any prominent warning device, such as a tag and a means of attachment that can be securely fastened to energy-isolating device in accordance with an established procedure.

A regulator 708 may be used to regulate the gas pressure of the process gas and a pressure gauge 710 may be used to monitor the pressure of the process gas. In one embodiment, the pressure may be preset and not need to be regulated. In another embodiment, a pressure transducer (not illustrated) having a display to display the pressure may be used. The pressure transducer may be positioned next to the regulator 708. A filter 712 may be used to remove impurities in the process gas. A primary shut-off valve 714 may be used to prevent any corrosive supply gasses from remaining in the gas stick. The primary shut-off valve 714 may be two-port valve having an automatic pneumatically operated valve assembly that causes the valve to become deactivated (closed), which in turn effectively stops plasma gas flow within the gas stick. Once deactivated, a non-corrosive purge gas, such as nitrogen, may be passed through a purge valve 716 to purge the gas stick. The purge valve 716 may have three-ports to provide for the purge process—an entrance port, an exit port and a discharge port. The corrosion sensor retainer assembly can include seals for connecting the three-ports of purge valve 716 to mixing manifold 722.

Adjacent the purge valve 716 may be a mass flow controller ("MFC") 718. The MFC 718 accurately measures the flow rate of the process gas. Positioning the purge valve 716 next to the MFC 718 allows a user to purge any corrosive process gasses in the MFC 718. A mixing valve 720 next to the MFC 718 may be used to control the amount of process gas to be mixed with other process gases on the gas panel.

Each component of the gas stick is preferably positioned above a stainless steel mixing manifold. A plurality of manifold blocks can form the mixing manifold 722 that creates the flow path of gas through the gas stick 700. Additional gas delivery system components may be positioned on the manifold blocks by any known means such as with a pressure fitting sealant (e.g., C-seal, W-seal, S-seal) and the like. The corrosion sensor assembly is configured to retain and monitor seals between the gas delivery system components and the mixing manifold 722 of the gas stick 700.

Preferably the corrosion sensor retainer assembly is configured to be placed between components of a gas stick, a manifold, a gas pallet, or a flow adaptor block of the gas delivery system. An exemplary embodiment of a flow adaptor block can be found in commonly-assigned U.S. Pat. No. 8,322,380 which is incorporated by reference herein in its entirety. The flow adaptor block can preferably include one or more horizontal or vertical conduits therein which are in fluid communication with one or more inlet ports or outlets ports thereof. An exemplary embodiment of a gas stick and mixing manifold can be found in commonly-assigned U.S. Published Patent Application No. 2010/0326554 which is incorporated by reference herein in its entirety. The mixing manifold can preferably include one or more horizontal or vertical conduits therein which are in fluid communication with one or more inlet ports or outlets ports thereof. For example, a stainless steel mixing manifold can be formed to support gas delivery components of a gas stick. Preferably each of the gas delivery components of the gas stick are supported on an upper surface of a support element (i.e. gas pallet) which includes inlet ports for receiving the respective gas delivery components wherein the inlet ports are in fluid communication with interconnected conduit paths disposed therebelow. Preferably vertical conduits of the interconnected conduit paths of the support element lead to a horizontal common manifold pathway and of the support element.

A semiconductor substrate can be processed in a semiconductor substrate processing apparatus including the gas delivery system with a corrosion sensor retainer assembly between components as disclosed herein. Preferably the semiconductor substrate is processed by supplying process gas from the gas delivery system, through a seal monitored by a corrosion sensor retainer assembly, to a vacuum chamber of the processing apparatus. The process gas is introduced into a processing region of the vacuum chamber of the processing apparatus. The semiconductor substrate is then processed with the process gas. Preferably the method of processing the semiconductor substrate includes deposition of conductive or dielectric material on the semiconductor substrate. Alternatively, in a preferred embodiment, the method of processing the semiconductor substrate includes plasma etching a layer on the semiconductor substrate wherein the layer is metal, dielectric, or photoresist.

Figures 4A, 4B:
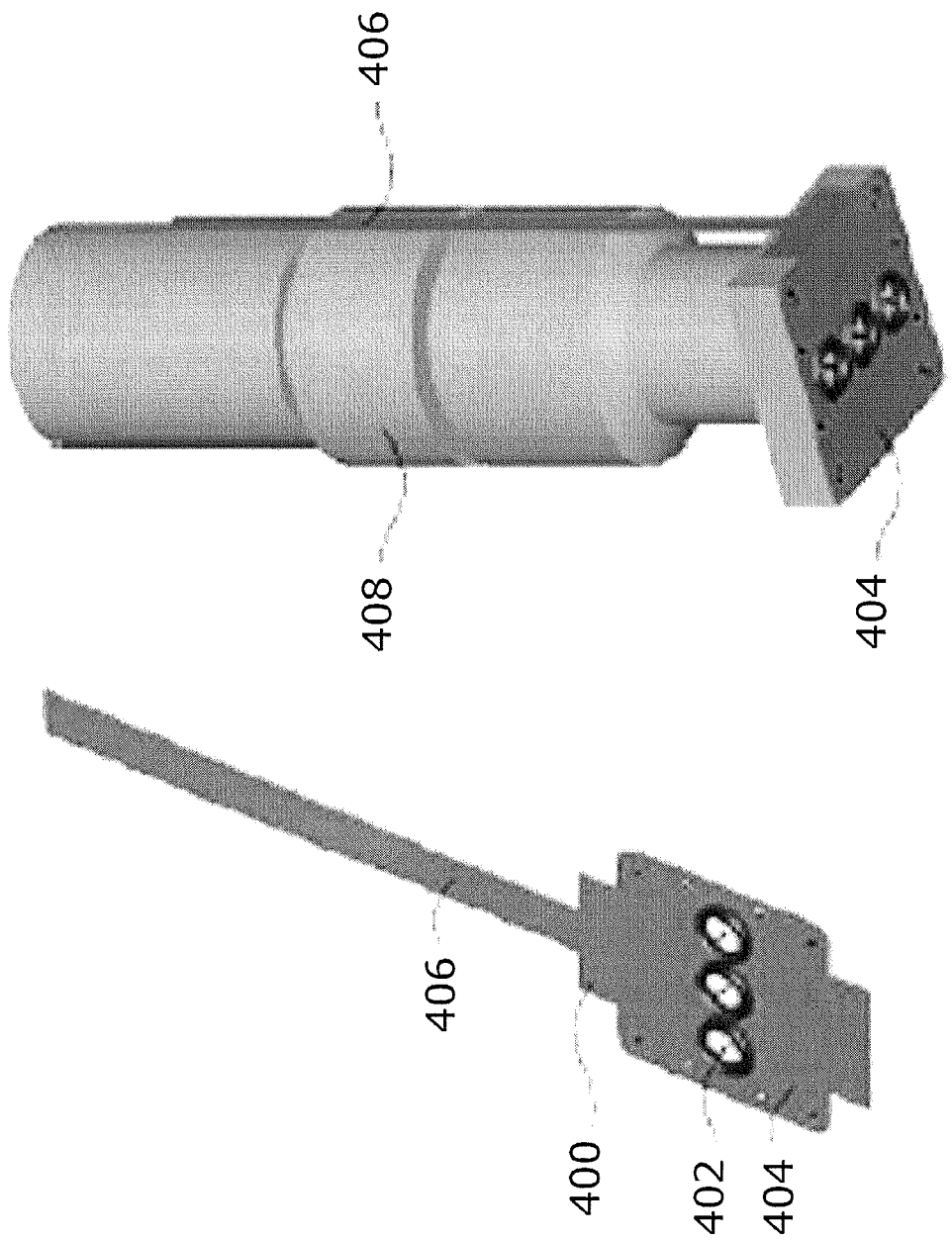
FIG. 4A illustrates an embodiment of a corrosion sensor retainer assembly in accordance with embodiments disclosed herein.
FIG. 4B illustrates an embodiment of a component of a gas stick fitted with the corrosion sensor retainer assembly shown in FIG. 4A in accordance with embodiments disclosed herein.

FIG. 4 illustrates an embodiment of a corrosion sensor retainer assembly as disclosed herein. As shown in FIG. 4A, corrosion sensor retainer assembly 400 is a planar structure with an end portion 404 and a tail portion 406. End portion 404 comprises one or more ports 402 for retaining a seal and can be configured in a shape that matches the footprint of a gas delivery system component. For example, end portion 404 can be configured to have a square, rectangular, or circular shape. Tail portion 406 houses connections for a monitoring circuit. In one embodiment corrosion sensor retainer assembly 400 comprises a laminate.

As shown in FIG. 4B Corrosion sensor retainer assembly 400 can be configured to fit securely beneath a gas delivery system component, such as a valve or a mass flow controller. For example, corrosion sensor retainer assembly 400 is shown wrapped around the bottom of gas delivery system component 408. End portion 404 has three ports retaining seals, which are connected to the bottom end of gas delivery system component 408. The tail portion 406 can be flexible and wraps around and alongside gas delivery system component 408.

Figure 5:
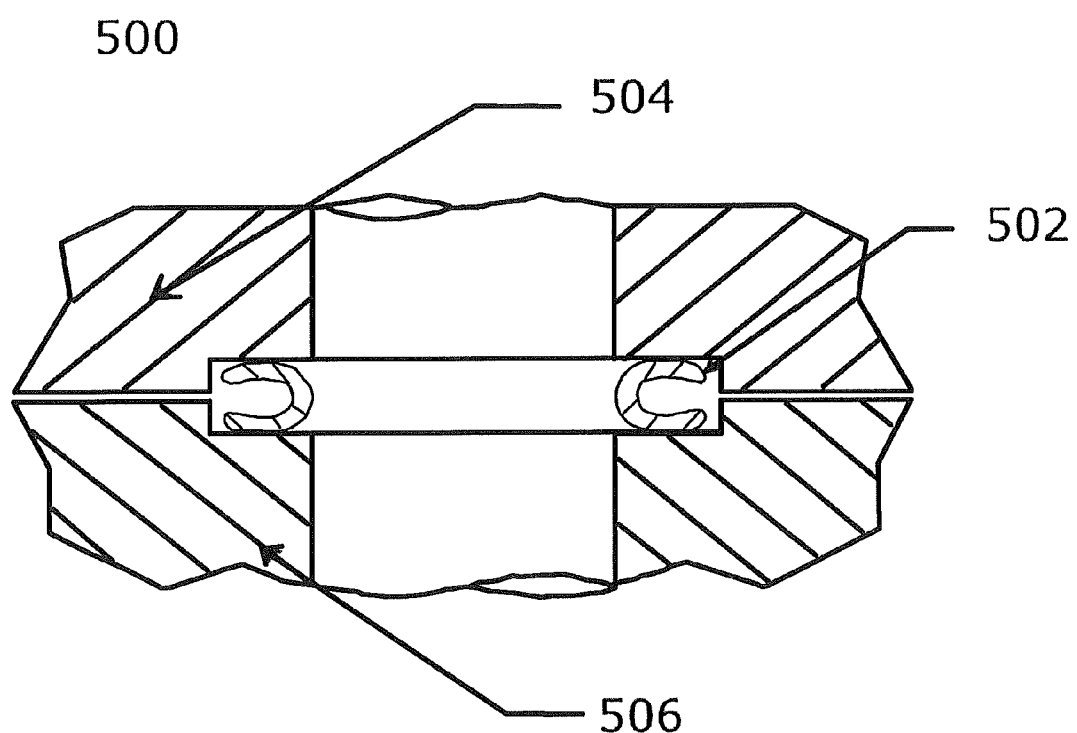
FIG. 5 illustrates a cross section of a corrosion sensor retainer assembly retaining a seal between components in accordance with embodiments disclosed herein.

Referring now to FIG. 5, a cross section of corrosion sensor retainer assembly 400 is illustrated. As shown in FIG. 5, C-seal 502 is retained by corrosion sensor retainer assembly 400. A C-seal is typically a metallic ring formed from a tube with a section removed, such that one side of the tube has two free ends. The cross-section of a C-seal resembles the letter "C." The cut out portion of the C-seal (e.g., the open portion of the "C") allows the C-seal to be mechanically compressed between two components to form a tight seal. While a C-seal is depicted in FIG. 5, corrosion sensor retainer assembly 400 can be configured to retain any type of seal, such as a W-seal, S-seal or an O-ring.

Corrosion sensor retainer assembly 400 can interface between a top fluid component 504 (e.g., a valve) and a bottom substrate 506 (e.g., a mixing manifold). FIG. 5 illustrates how the corrosion sensor retainer assembly 400 with C-seal 502 creates a continuous path for fluid to flow between top fluid component 504 and bottom substrate 506. Together, the corrosion sensor retainer assembly 400 with C-seal 502, top fluid component 504, and bottom substrate 506 form a gas tight sealing structure. Also shown is FIG. 5 is a small gap between top fluid component 504 and bottom substrate 506 in which corrosion sensor retainer assembly 400 resides. In order to ensure a tight fit between components, corrosion sensor retainer assembly 400 can be made very thin, for example, about 3 to 5 millimeters in thickness.

As C-seal 502 becomes corroded or leaks, process gas flows between top fluid component 504 and bottom substrate 506. As discussed above, when process gas, such as hydrogen containing process gas, is exposed to moisture, a strong acid can be created. Acid can quickly destroy C-seal 502, fluid component 504, and/or bottom substrate 506. If left undetected, the acid can destroy the entire gas stick and surrounding equipment, in addition to the semiconductor wafer being processed. Thus, early detection can prevent major failures. The monitoring circuit included in corrosion sensor retainer assembly 400 is configured to monitor C-seal 502 for leakage and identify leaks to prevent major failures from occurring.

Figure 6A:
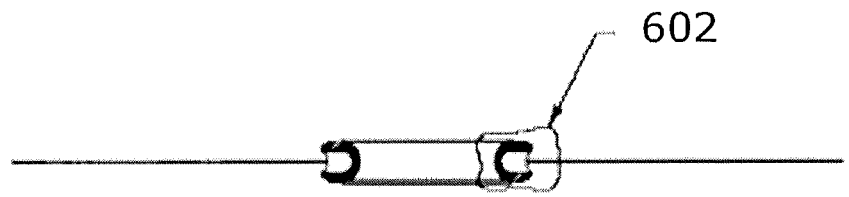
FIG. 6A illustrates a corrosion sensor retainer assembly retaining a seal in accordance with embodiments disclosed herein.
Figure 6B:
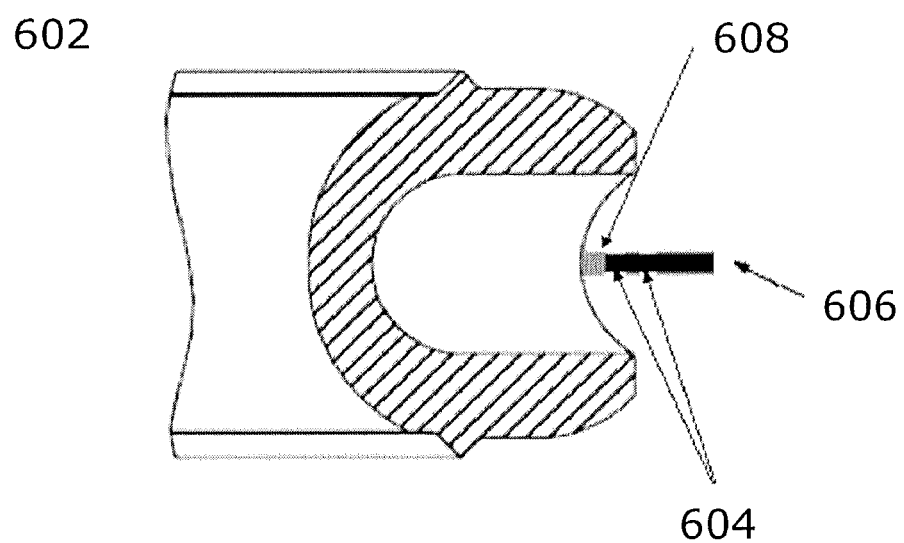
FIG. 6B illustrates a detailed view of a portion of the corrosion sensor retainer assembly shown in FIG. 6A near the edge of a seal in accordance with embodiments disclosed herein.

FIG. 6A and FIG. 6B illustrate two views of an embodiment of corrosion sensor retainer assembly 400. FIG. 6A shows corrosion sensor retainer assembly 400 retaining a C-seal from a side view and FIG. 6B details a close up view of portion 602, which is a portion of corrosion sensor retainer assembly 400 near the edge of C-seal 502. In FIG. 6B, portion 602 shows a detailed side view of corrosion sensor retainer assembly 400 near the edge of C-seal 502, in which different laminate layers are shown. Corrosion sensor retainer assembly 400 can be a laminate that comprises three layers. A conductor 606 forms part of a monitoring circuit that is sandwiched between two insulating layers within the laminate. The insulating layers of the laminate are formed from an insulating material such as a polyimide film. Polyimide is a chemically inert material, which reduces gas stick contamination and can be used for all plasma gases. DuPont's Kapton material is an example of such a polyimide film.

As shown in FIG. 6B, the insulating layers of the laminate can include cut out portions 604 wherein the insulating material has been removed. The cut out portions 604 expose areas of conductor 606 near the edge of C-seal 502. Conductor 606 can be a metal such a stainless steel. Conductor 606 can be made from the same type of stainless steel that is used for the gas fluid delivery system and components (e.g., 303 SST). Alternatively, conductor 606 can be made from an inferior grade of stainless steel or inferior metal. The type of metal used for conductor 606 can be selected such that it dissolves in the presence of acid at the same rate or faster than the type of metal that is primarily used for the fluid delivery system and components.

The exposed areas 604 of conductor 606 can be located near the edge of a seal. The exposed surface of conductor 606 is preferably located at a distance of about two millimeters or less away from an edge of a port within the laminate that is configured to retain a seal. In this way, acid leaking through the seal can interact with the exposed areas of conductor 606 first and cause the surface of conductor 606 to dissolve. Conductor 606 forms part of a monitoring circuit and is configured to send a signal in response to the exposed portion of the conductor becoming corroded and/or disconnected.

Corrosion sensor retainer assembly 400 includes a monitoring circuit that can monitor at least one parameter related to conductor 606, which can include a voltage, a resistance, or a current of the circuit. For example, a voltage, a resistance or a current of the monitoring circuit can change when the exposed portion of conductor 606 is in the presence of corrosive gas or acid. Also, the parameter related to conductor 606 can be based on the monitoring circuit being in a disconnected state. For example, when the exposed portion of conductor 606 is dissolved by acid or corrosive gas, the discontinuity will cause the circuit to "break." For example, any signals flowing through the monitoring circuit will be interrupted. A parameter of the monitoring circuit is compared to a predetermined stored value. If the monitored parameter is less than or equal to the predetermined value, then the monitoring circuit determines that the conductor is in the presence of a corrosive gas or acid and can send an alarm signal. The monitoring circuit can be connected to a PC board or a computer in order to report an alarm signal. A PC board or computer connected to the monitoring circuit of corrosions sensor retainer assembly 400 can report the alarm signal to interested parties via the Internet or other network.

Figure 7:
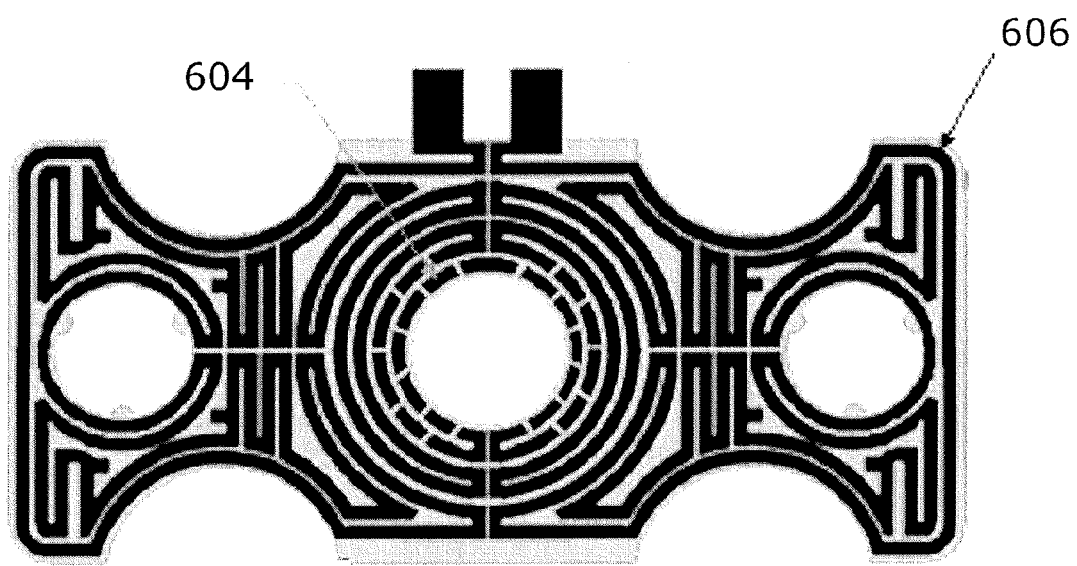
FIG. 7 illustrates an embodiment of the corrosion sensor retainer assembly in accordance with embodiments disclosed herein.

FIG. 7 illustrates a top view of the end portion of the corrosion sensor retainer assembly 400. As discussed above, corrosion sensor retainer assembly 400 is made of a laminate. The top layer of the laminate is shown in a transparent state, in order to depict a path of conductor 606, forms part of the monitoring circuit. Conductor 606 is housed within a laminate comprising multiple layers. The laminate can comprise at least a first insulating layer, including three ports and at least a second insulating layer, including three corresponding ports. Together, the corresponding ports within each layer can respectably align with each other to retain one or more seals. As shown in FIG. 7, the laminate can have three ports or holes through each layer, such that corrosion sensor retainer assembly 400 is configured to retain three seals.

Also shown in FIG. 7 is a path for conductor 606 that can extend around at least part of a first port and a second port that are configured to align and retain a seal. Conductor 606 can be housed within the laminate between the first insulating layer and the second insulating layer. At least a portion of the path of conductor 606 has an exposed surface. The outer insulating layers of the laminate can be formed from precut portions with holes spaced apart near the edges of seals or any desired location on corrosion sensor retainer assembly 400. Exposed areas 604 is an area above conductor 606 where insulating material has been removed. Exposed areas 604 can be located near the edge of a hole for retaining a seal, in order to quickly detect any leakage.

In an embodiment shown in FIG. 7, conductor 606 forms a winding path around three ports for retaining seals. The path of the conductor 606 can take any pattern and FIG. 7 shows one example of a possible pattern. While only one continuous conductor is show within the laminate in FIG. 7, the laminate of the corrosion sensor retainer assembly 400 can include multiple conductors, wherein the conductors form part of a plurality of monitoring circuits. For example, separate conductors can be used to detect corrosion in different segments or areas of corrosion sensor retainer assembly 400. Detection areas can be divided into different quadrants or areas. Alternatively, each seal can have its own dedicated monitoring circuit with a dedicated conductor.

In an embodiment where corrosion sensor retainer assembly 400 contains different conductors for respective monitoring circuits, the conductors can be made of differing materials or have differing amounts of surface area exposed. In addition, the different conductors can be placed at different locations and/or form different paths within the laminate. In this way, the different monitoring circuits can be used to detect different degrees of leakage and corrosion. For instance, a conductor of a first monitoring circuit can be set to be more sensitive than a conductor of a second monitoring circuit. Also, a conductor of a monitoring circuit can have an exposed surface that is located closer to an edge of a seal than an exposed surface of another conductor of a different monitoring circuit. In an alternative embodiment, different conductors can be monitored by the same monitoring circuit.

Figure 8A:
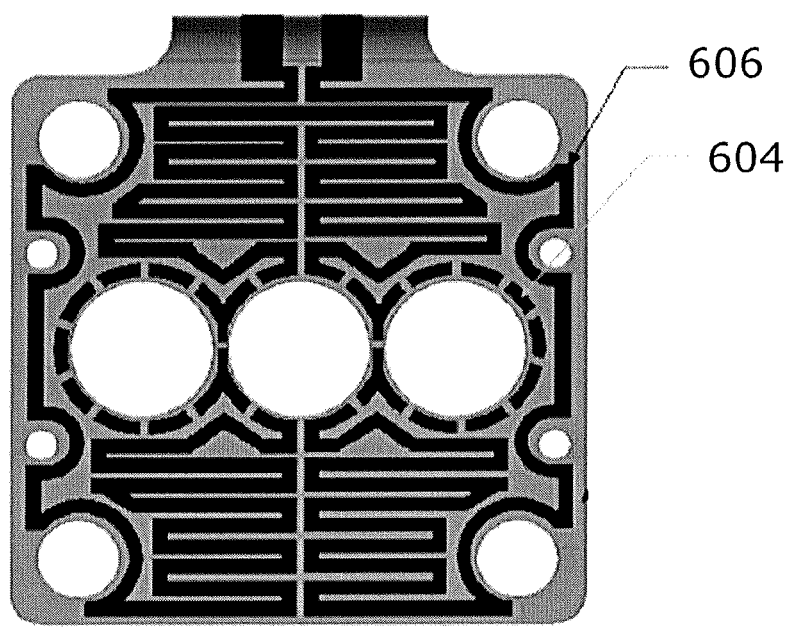
FIG. 8A illustrates an embodiment of the corrosion sensor retainer assembly in accordance with embodiments disclosed herein.
Figure 8B:
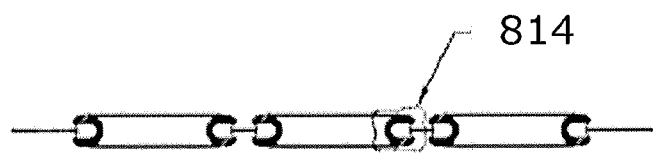
FIG. 8B illustrates a side view of the corrosion sensor retainer assembly shown in FIG. 8A in accordance with embodiments disclosed herein.
Figure 8C:
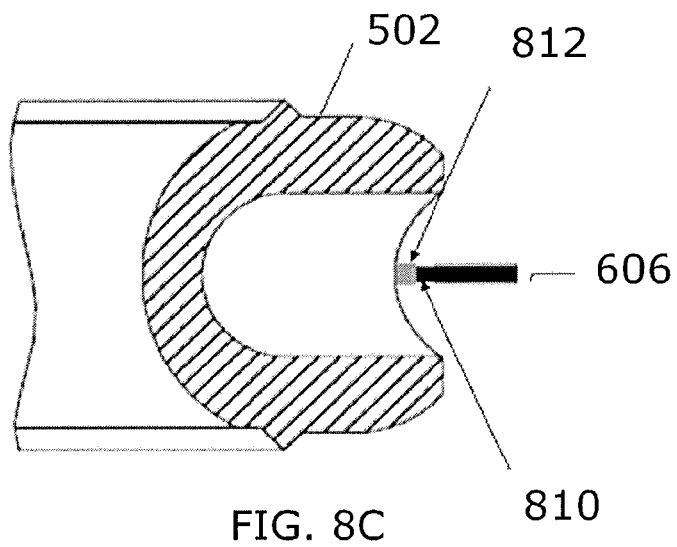
FIG. 8C illustrates a detailed view of a portion of the corrosion sensor retainer assembly shown in FIG. 8B.

Referring now to FIG. 8 three views of corrosion sensor retainer assembly 400 are shown. FIG. 8A illustrates a top view, FIG. 8B illustrates a side view, and FIG. 8C illustrates a close up side view of corrosion sensor retainer assembly 400 near the edge of a seal. FIG. 8A illustrates another exemplary pattern for conductor 606, in which conductor 606 forms a winding path around three ports for retaining seals. While conductor 606 is show as a single continuous conductor within the laminate in FIG. 8A, the laminate of the corrosion sensor retainer assembly 400 can include multiple conductors, wherein the conductors form part of one or more monitoring circuits. The conductor can take any path around ports within the laminate. For example, FIG. 8A shows conductor 606 partially surrounding some ports and fully surrounding other ports. Also, the conductor 606 can form a winding path that overlaps itself as it traverses the area covered by the laminate of corrosion sensor retainer assembly 400.

The detailed side view depicted in FIG. 8B shows corrosion sensor retainer assembly 400 in a configuration retaining three C-seals. FIG. 8C shows a detailed view of the outlined portion 814 shown in FIG. 8B, in which conductor 606 near the edge of a C-seal shows conductor 606 with a single exposed surface area 810. FIG. 8C shows an insulating surface 812 of the laminate next to exposed surface area 810. Conductor 606 has Kapton or another insulating material on both sides of exposed surface area 810. Thus, if C-seal 502 begins to leak corrosive gas or acid, exposed surface area 810 of conductor 606 will begin to corrode or dissolve shortly thereafter. Thus, the leakage can be detected at an early stage in the corrosion process and a major catastrophic failure can be prevented.

While embodiments disclosed herein have been described in detail with reference to specific embodiments thereof, it will be apparent to those skilled in the art that various changes and modifications can be made, and equivalents employed, without departing from the scope of the appended claims.

What is claimed is:

1. A corrosion sensor retainer assembly for predicting and detecting corrosion within a fluid delivery system of a vacuum chamber, the corrosion sensor retainer assembly comprising:
   a seal consisting of metallic material;
   a laminate comprising at least a first insulating layer, including at least a first port, and at least a second insulating layer, including at least a second port, wherein the first port and the second port are configured to retain the seal;
   at least one conductor forming a path that extends around at least part of the first port and the second port, wherein the conductor is housed within the laminate between the first insulating layer and the second insulating layer; and
   at least a portion of the path of the conductor having an exposed surface.

2. The corrosion sensor retainer assembly of claim 1, wherein the conductor forms part of a monitoring circuit and is configured to send a signal in response to the exposed surface of the conductor becoming corroded.

3. The corrosion sensor retainer assembly of claim 1, wherein the conductor forms part of a monitoring circuit and is configured to send a signal in response to the exposed surface of the conductor becoming disconnected.

4. The corrosion sensor retainer assembly of claim 1, wherein the first insulating layer or the second insulating layer comprises an aperture which resides over the portion of the conductor having the exposed surface.

5. The corrosion sensor retainer assembly of claim 1, wherein the portion of the conductor having the exposed surface is located at a distance of two millimeters or less away from an edge of the first port and an edge of the second port.

6. The corrosion sensor retainer assembly of claim 1, wherein the conductor comprises stainless steel.

7. The corrosion sensor retainer assembly of claim 1, wherein the first insulating layer and the second insulating layer comprise polyimide.

8. The corrosion sensor retainer assembly of claim 1, wherein the laminate is configured to interface between an integrated surface mount component and a mixing manifold.

9. The corrosion sensor retainer assembly of claim 1, wherein a thickness of the laminate is less than or equal to 5 millimeters.

10. A gas block comprising the corrosion sensor retainer assembly of claim 1, wherein the gas block and the corrosion sensor retainer assembly are configured to permit a gas to flow through the gas block into a semiconductor processing chamber and the corrosion sensor retainer assembly via the first port and the second port.

11. A vacuum chamber comprising a gas block which includes the corrosion sensor retainer assembly of claim 1, wherein the gas block and the corrosion sensor retainer assembly are configured to permit a gas to flow through the gas block and the corrosion sensor retainer assembly via the first port and the second port.

12. The vacuum chamber of claim 11, wherein the vacuum chamber is a plasma etching chamber.

13. A method of predicting and detecting corrosion within a fluid delivery system of a vacuum chamber with a corrosion sensor retainer assembly, said method comprising:

passing a fluid through a seal consisting of metallic material, the seal being retained by a corrosion sensor retainer assembly, wherein the corrosion sensor retainer assembly includes a laminate comprising at least a first insulating layer, including at least a first port, and at least a second insulating layer, including at least a second port;

retaining the seal by the first port and the second port;

monitoring a parameter of a circuit that includes at least one conductor forming a path that extends around at least part of the first port and the second port, wherein the conductor is housed within the laminate between the first insulating layer and the second insulating layer, and at least a portion of the path of the conductor having an exposed surface, wherein the parameter is related to a property of the exposed surface;

comparing the parameter to a predetermined value; and detecting the presence of a leak in the seal based on a result of the comparison.

14. The method of claim 13, wherein the parameter is based on a voltage, a resistance, or a current of the circuit.

15. The method of claim 13, wherein the fluid is a corrosive gas or acid, the method further comprising: detecting the presence of a corrosive gas or acid.

16. The method of claim 13, wherein the parameter is based on the circuit being in a disconnected state.

17. The method of claim 13, wherein the fluid is a processing gas.

18. The method of claim 17, wherein the processing gas is a hydrogen containing gas or hydrogen bromide.

19. The method of claim 13, wherein the vacuum chamber is a plasma etching chamber and the fluid is a halogen-containing gas.

20. The method of claim 13, wherein the seal is in a gas block supplying processing gas to a plasma etching chamber, in which a single semiconductor substrate is plasma etched.

* * * * *